United States Patent
Maute et al.

(10) Patent No.: US 9,236,546 B2
(45) Date of Patent: Jan. 12, 2016

(54) OPTOELECTRONIC COMPONENTS

(71) Applicant: OSRAM Opto Semiconductors GmbH, Regensburg (DE)

(72) Inventors: Markus Maute, Alteglofsheim (DE); Jürgen Moosburger, Regensburg (DE); Simon Jerebic, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/682,258

(22) Filed: Apr. 9, 2015

(65) Prior Publication Data

US 2015/0214450 A1    Jul. 30, 2015

Related U.S. Application Data

(62) Division of application No. 14/009,921, filed as application No. PCT/EP2012/054598 on Mar. 15, 2012, now Pat. No. 9,041,014.

(30) Foreign Application Priority Data

Apr. 8, 2011  (DE) .......................... 10 2011 016 567

(51) Int. Cl.
  *H01L 33/00*  (2010.01)
  *H01L 33/60*  (2010.01)
  *H01L 33/50*  (2010.01)
  *H01L 33/20*  (2010.01)
  *H01L 33/48*  (2010.01)
  *H01L 33/44*  (2010.01)
  *H01L 33/56*  (2010.01)

(52) U.S. Cl.
  CPC ................ *H01L 33/60* (2013.01); *H01L 33/20* (2013.01); *H01L 33/44* (2013.01); *H01L 33/48* (2013.01); *H01L 33/486* (2013.01); *H01L 33/501* (2013.01); *H01L 33/56* (2013.01); *H01L 2933/0091* (2013.01)

(58) Field of Classification Search
  CPC ........ H01L 33/56; H01L 33/44; H01L 33/486
  See application file for complete search history.

(56) References Cited

U.S. PATENT DOCUMENTS

| | | |
|---|---|---|
| 2002/0093081 A1 | 7/2002 | Ueda et al. |
| 2004/0041507 A1 | 3/2004 | Ito |

(Continued)

FOREIGN PATENT DOCUMENTS

TW    2006-39448 A    11/2006

OTHER PUBLICATIONS

English translation of Taiwanese Notification for the Opinion of Examination mailed Jul. 14, 2014 from corresponding Taiwanese Application No. 101111 6682.

(Continued)

*Primary Examiner* — Ngan Ngo
(74) *Attorney, Agent, or Firm* — DLA Piper LLP (US)

(57) ABSTRACT

An optoelectronic component includes a carrier; a semiconductor chip having an active layer that generates radiation and is arranged on a carrier; a dispersed material including a matrix material and particles embedded therein arranged on the semiconductor chip and/or the carrier at least in regions, and is integral therewith; and a separating edge between the dispersed material and matrix material formed at a chip edge of the semiconductor chip.

8 Claims, 3 Drawing Sheets

(56) References Cited

U.S. PATENT DOCUMENTS

| | | |
|---|---|---|
| 2004/0051111 A1 | 3/2004 | Ota et al. |
| 2006/0068128 A1 | 3/2006 | Greener et al. |
| 2006/0091788 A1 | 5/2006 | Yan |
| 2006/0220046 A1 | 10/2006 | Yu et al. |
| 2007/0228932 A1* | 10/2007 | Amano .................. C09K 11/06 313/502 |
| 2008/0054287 A1 | 3/2008 | Oshio et al. |
| 2008/0057342 A1 | 3/2008 | Sekiya |
| 2008/0164807 A1 | 7/2008 | Hofmann et al. |
| 2008/0308825 A1 | 12/2008 | Chakraborty et al. |
| 2009/0134415 A1 | 5/2009 | Morioka |
| 2010/0176713 A1* | 7/2010 | Hanamoto .......... C01B 21/0826 313/501 |
| 2010/0291313 A1 | 11/2010 | Ling |
| 2012/0032578 A1* | 2/2012 | Annen .................. B82Y 30/00 313/483 |
| 2012/0080070 A1 | 4/2012 | Tsakalakos et al. |
| 2013/0171405 A1 | 7/2013 | Meschter et al. |
| 2013/0228812 A1* | 9/2013 | Annen .................. H01L 33/504 257/98 |
| 2013/0334557 A1* | 12/2013 | Uchida ................ H01L 23/564 257/98 |
| 2014/0021503 A1* | 1/2014 | Yoshida ............... H01L 33/507 257/98 |
| 2014/0139101 A1* | 5/2014 | Masuda ................ B82Y 30/00 313/503 |

OTHER PUBLICATIONS

English translation of a First Office Action dated Sep. 2, 2015 of corresponding Chinese Application No. 201280017260.9.

* cited by examiner

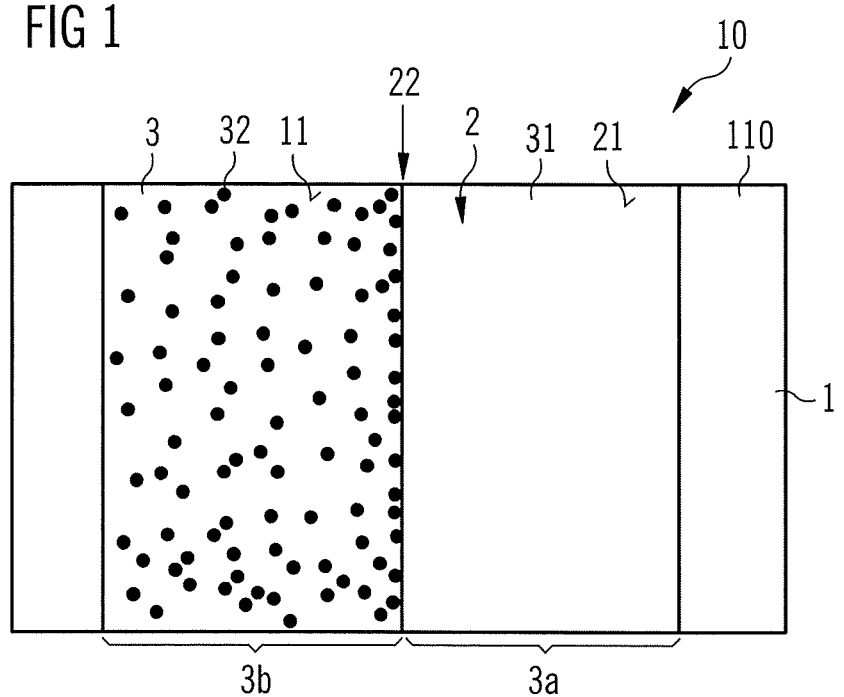

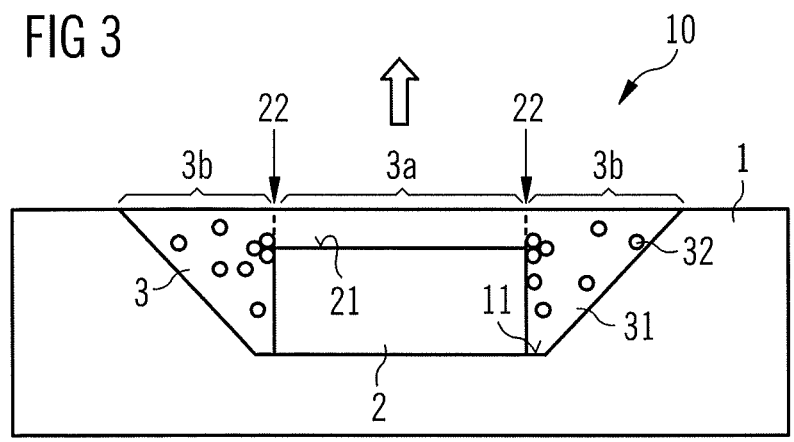
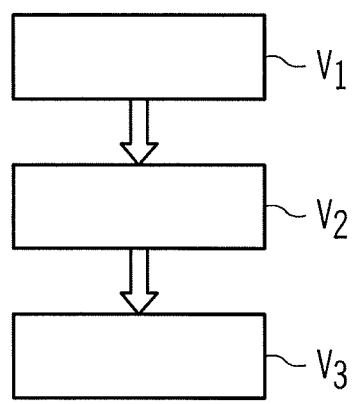

OPTOELECTRONIC COMPONENTS

RELATED APPLICATIONS

This application is a divisional of U.S. application Ser. No. 14/009,921, filed Nov. 15, 2013, which is a §371 of International Application No. PCT/EP2012/054598, with an international filing date of Mar. 15, 2012 (WO 2012/136459 A1, published Oct. 11, 2012), which is based on German Patent Application No. 10 2011 016 567.3, filed Apr. 8, 2011.

TECHNICAL FIELD

This disclosure relates to methods of producing an optoelectronic component comprising a semiconductor chip and a dispersed material, and to components.

BACKGROUND

It is conventionally known to apply dispersed materials to a semiconductor chip. In that case, the dispersed materials comprise, for example, a matrix material and reflective particles embedded therein. During application to the semiconductor chip, care should be taken to ensure that the reflective particles do not deposit on the chip surface to not adversely influence coupling-out efficiency of the semiconductor chip. A separation between surfaces to be coated and not to be coated is conventionally achieved by the spatially targeted application of the dispersed material. The volume of the dispersed material is controlled such that the surfaces that are not to be coated remain clean, that is to say no dispersed material deposits thereon. What is disadvantageous, however, is that the volume of the dispersed material is limited in such a method, as a result of which, however, reflectivity at the reflective particles of the dispersed material is likewise disadvantageously limited. At the same time, the process reliability is low and requires increased process control.

It could therefore be helpful to provide a method of producing an optoelectronic component which avoids the disadvantages mentioned above. Furthermore, it could be helpful to provide a component produced in which the coupling-out efficiency is increased and at the same time a lateral radiation emission is suppressed in an improved manner.

SUMMARY

We provide methods of producing an optoelectronic component including providing a semiconductor chip having an active layer that generates radiation and is arranged on a carrier, applying a dispersed material including a matrix material and particles embedded therein to the semiconductor chip and/or the carrier at least in regions, wherein before the dispersed material is applied, at least one chip edge of the semiconductor chip facing away from the carrier is modified such that the dispersed material at least partly separates into its constituents during application at the chip edge.

We also provide optoelectronic components including a semiconductor chip having an active layer that generates radiation and is arranged on a carrier, wherein a dispersed material including a matrix material and particles embedded therein is arranged on the semiconductor chip and/or the carrier at least in regions, and is integral therewith, and a separating edge between the dispersed material and matrix material is formed at a chip edge of the semiconductor chip.

We further provide methods of producing an optoelectronic component including providing a semiconductor chip having an active layer that generates radiation and is arranged on a carrier, applying a dispersed material including a matrix material and particles embedded therein to the carrier at least in regions, wherein before the dispersed material is applied, at least one chip edge of the semiconductor chip facing away from the carrier is coated with a protective layer at least in places for modification such that the dispersed material at least partly separates into its constituents during application at the chip edge, and the protective layer changes the surface energy of the semiconductor chips such that the dispersed material does not adhere to a chip surface facing away from the carrier.

BRIEF DESCRIPTION OF THE DRAWINGS

FIG. 1 shows a schematic plan view of an example of a component.

FIG. 3 shows a schematic cross section of an example of a component.

FIG. 4 shows a flowchart concerning our method of producing a component.

DETAILED DESCRIPTION

Figure 2A:
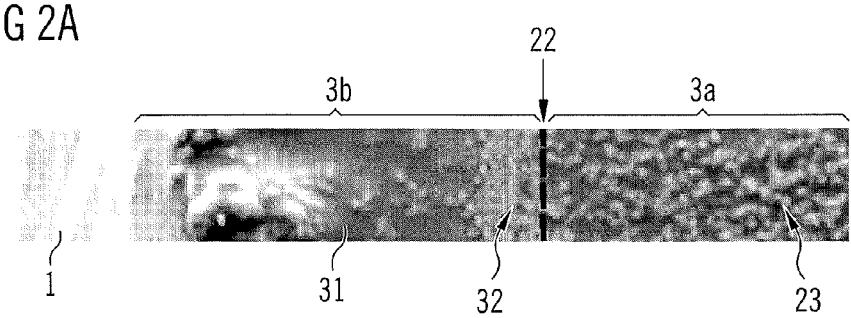
FIG. 2A shows a recording of the plan view of the component in accordance with the example in FIG. 1.

Our methods of producing optoelectronic components may comprise the following method steps:
  providing a semiconductor chip, which has an active layer that generates radiation and is arranged on a carrier,
  applying a dispersed material to the semiconductor chip and/or the carrier at least in regions, the material comprising a matrix material and particles embedded therein, wherein
  before the dispersed material is applied, at least one chip edge of the semiconductor chip facing away from the carrier is modified such that the dispersed material at least partly separates into its constituents during application at the chip edge.

What can be achieved by targeted alteration of the chip edge is that the dispersion separates upon contact with the chip edge. Preferably, a separation of the dispersed material into the matrix material and the particles takes place as a result of the modification at the chip edge. This affords the possibility of keeping specific areas free of the dispersed solid, while other areas are simultaneously covered with the complete dispersion.

Accordingly, the separation preferably takes place such that regions of the dispersed material comprise only the matrix material and no particles, while other regions comprise the dispersed material comprising matrix material and particles embedded therein. Regions which consist only of the matrix material are preferably formed in the dispersed material. In this case, the dispersed material comprising the different regions is integral and therefore applied jointly in one method step.

The particles of the dispersed material are reflective particles, for example. The dispersed material comprising the particles is preferably not deposited at the chip surface, but rather only laterally with respect to the semiconductor chip. In this case, the reflective particles serve as a reflector of the radiation emitted by the semiconductor chip as a result of which the coupling-out efficiency of such a component during operation is advantageously increased. Moreover, the undesirable lateral radiation emission from the component can be suppressed with a dispersed material applied in this way such that the component emits radiation preferably in a forward direction.

The term "chip edge" preferably relates to an edge of a radiation exit area of the semiconductor chip. The term "chip edge" can likewise denote an outer boundary line as seen in a plan view of the radiation exit area. The modification can be restricted to a region of the semiconductor chip which extends from the chip edge toward an inner region of the semiconductor chip as seen in plan view. Side areas of the semiconductor chip, in particular outside the chip edges and/or proceeding from the chip edges in a direction away from the radiation exit area, can be free of the modification.

The semiconductor chip is preferably an optoelectronic semiconductor chip which makes it possible to convert electronically generated data or energy into light emission, or vice versa. By way of example, the optoelectronic semiconductor chip is a radiation-emitting semiconductor chip. The semiconductor chip is preferably an LED, particularly preferably a thin-film LED. In the context of the application, a thin-film LED is considered to be an LED during whose production the growth substrate on which the semiconductor body was grown epitaxially is preferably completely stripped away.

The emission characteristic of the component describes the angle dependence of the light intensity relative to the intensity in a main emission direction. In this case, the main emission direction is the vertical direction relative to the lateral extent of the active layer or of the semiconductor chip.

A separating edge between the dispersed material and the matrix material may be formed as a result of the modification at the chip edge. In particular, the particles may be held back at the separating edge. The separating edge accordingly separates the dispersed material such that only the matrix material is present on one side of the separating edge and the matrix material with particles embedded therein is present on the other side of the separating edge. The matrix material without particles is preferably arranged on the chip surface. By way of example, the dispersed material comprising matrix material and embedded particles is formed alongside the chip and alongside the chip edge and only the matrix material is formed on the chip.

A filter function of the particles may be formed as a result of the modification at the chip edge. The chip edge accordingly may have a filter function for the solid constituents of the dispersion. In this case, the particles are held back behind the chip edge. Thus, there is the possibility of keeping the chip surface free of the dispersed solid, while alongside the semiconductor chip the carrier is covered with the complete dispersion.

The particles may be deposited at the chip edge as a result of the modification. Therefore, the particles may be held back at the chip edge as a result of which the particles accumulate at this location. As a result, the particles deposit in a higher concentration at the chip edge, which advantageously has the effect that undesirable lateral radiation emission is suppressed in an improved manner. In this case, the chip surface has hardly any or no particles. Embedded particles are present in the remaining regions of the dispersed material, wherein the greatest proportion of the embedded particles is present at the chip edge.

A chip surface facing away from the carrier may be modified in addition to the chip edge. In this case, not only the chip edge is altered in a targeted manner, but likewise the chip surface such that the chip surface is additionally embodied such that no particles adhere thereon. What can thus furthermore be achieved is that no reflective particles, for example, are added on the chip surface and, as a result, the radiation efficiency does not disadvantageously decrease or change.

The matrix material may contain silicone and the particles may contain $TiO_2$. The particles are accordingly reflective particles suitable to scatter the radiation emitted from the semiconductor chip. In this case, these $TiO_2$ particles are advantageously not added on the chip surface, but rather alongside the semiconductor chip, where they advantageously serve as a reflector such that the coupling-out efficiency increases and radiation emitted laterally from the component is suppressed.

The carrier may be part of a housing having a cavity into which the semiconductor chip is arranged. In this case, the dispersed material is applied in the chip housing, wherein the material is added only at specific locations in the housing.

Further semiconductor chips may be applied on the carrier before the dispersed material is applied, the further semiconductor chips being coated with a protective layer at least in places for the purpose of modification. The carrier and the semiconductor chips form, for example, a semiconductor wafer which is processed further in subsequent method steps. In this case, the protective layer is applied to the semiconductor chips, for example, in a common method. In this case, the carrier is preferably planar, that is to say is not part of the housing.

The protective layer may change the surface energy of the semiconductor chips such that the dispersed material does not adhere on the surface of the semiconductor chips. In this case, dispersions applied to the wafer laterally advantageously cannot creep onto the surfaces of the semiconductor chips and deposit there, and no reflective particles are deposited on the surfaces.

The protective layer may contain polytetrafluoroethylene, also designated as Teflon.

The protective layer may completely cover that surface of the semiconductor chip facing away from the carrier. It is likewise possible for the protective layer to cover the surface only partly and to be applied only along the chip edge. The protective layer is preferably transmissive to radiation generated by the semiconductor chip during operation.

The protective layer may have a thickness of at most 100 nm or of at most 50 nm or of at most 25 nm. Alternatively or additionally, the thickness of the protective layer can be at least 1 nm or at least 5 nm or at least 10 nm.

Modification of the chip edge may be realized by structuring the top side of the semiconductor chip facing away from the carrier and/or of side areas of the semiconductor chip which are oriented transversely with respect to the top side. The structuring can be a roughening of the top side and/or of the side areas. It is possible for the structuring to extend across the entire top side or for the structuring to extend only along the chip edge at the top side and/or at the side areas.

Structuring may be formed by elevations at the top side. The elevations may in particular be pyramidal or in the shape of truncated pyramids. By way of example, the elevations are produced by etching. An average height of the elevations is preferably at least 0.5 μm and/or at most 1.5 μm. An average sidewall angle of the elevations is, for example, between 45° to 70°.

The particles of the dispersed material may have an average diameter that is of at least half the magnitude or of at least the same magnitude as the average height of the elevations. Alternatively or additionally, the average diameter is at most double the average height of the elevations. With such elevations, in interplay with such particles, a type of comb or filter can be realized in which the particles, in particular only the particles, are caught.

The particles may pass, as seen in plan view from the chip edge and toward a center of the top side of the semiconductor chip, at most up to 50 µm or at most up to 20 µm or at most up to 10 µm onto the top side. This does not rule out a negligible proportion of the particles, for example, at most 1% also passing further onto the top side. Likewise, the top side, as seen in plan view, can be free of the particles such that no or substantially no particles passed onto the top side. The matrix material can pass further onto the surface than the particles.

The optoelectronic component may comprise a semiconductor chip which comprises an active layer that generates radiation and is arranged on a carrier. A dispersed material may be arranged on the semiconductor chip and/or the carrier at least in regions. The dispersed material comprises a matrix material and particles embedded therein and is integral. A separating edge between the dispersed material and the matrix material is formed at a chip edge of the semiconductor chip.

The features and advantages mentioned in conjunction with the production method also apply to the component, and vice versa.

The particles of the dispersed material are reflective particles. At the separating edge, the dispersed material is divided such that matrix material is situated on the chip surface of the semiconductor chip, while the particles are deposited at the chip edge, as a result of which the emission characteristic of the component is not disadvantageously influenced. Moreover, a lateral coupling-out radiation is advantageously suppressed by the particles arranged laterally with respect to the chip.

The matrix material may be integral across the separating edge. By way of example, the matrix material is applied in a common method step.

The matrix material may be arranged on a chip surface facing away from the carrier and dispersed material may be arranged on a carrier surface. In this case, the matrix material of the dispersed material on the carrier surface is integral with the matrix material on the chip surface such that no disadvantageous total reflection effects occur between the matrix material of the chip surface and the dispersed material of the carrier surface. As a result, reflection of the radiation back into the semiconductor chip is advantageously reduced, as a result of which the coupling-out efficiency is furthermore advantageously increased.

The particles of the dispersed material may be deposited at the chip edge. In this case, the particles are deposited not only at the chip edge, but also in the dispersed material alongside the semiconductor chip. However, the greatest proportion of the particles may be deposited at the chip edge as a result of which the lateral radiation emission from the component can advantageously be further suppressed.

Further advantages and advantageous developments will become apparent from the examples described below in conjunction with FIGS. 1 to 4.

In the figures, identical or identically acting constituent parts may in each case be provided with the same reference signs. The constituent parts illustrated and their size relationships among one another should not be regarded as true to scale. Rather, individual constituent parts such as, for example, layers, structures, components and regions may be illustrated with exaggerated thickness or size dimensions to enable better illustration and/or to afford a better understanding.

FIG. 1 shows a plan view of a component 10 comprising a carrier 1 and a semiconductor chip 2 arranged thereon. The semiconductor chip 2 is, for example, an LED, preferably a thin-film LED.

The semiconductor chip 2 has a semiconductor body composed of a semiconductor material. The semiconductor material is a III/V semiconductor material, for example. The semiconductor chip has an active layer provided to generate radiation. The semiconductor chip 2 comprises epitaxially deposited layers which form the chip, wherein the active layer is integrated in the layers.

The semiconductor chip 2 has a radiation exit side from which the greatest portion of the radiation emitted in the active layer is coupled out from the chip. In this case, the radiation exit side forms a chip surface 21, which is illustrated in plan view in the example in FIG. 1.

The carrier 1 is, for example, planar and preferably is a carrier plate. Alternatively, the carrier 1 can be part of a housing. In this case, the housing has a cavity into which the semiconductor chip 2 is arranged. In the example in FIG. 1, the carrier 1 is part of such a housing 110.

Dispersed material is introduced in the cavity of the housing and fills the cavity. In this case, the dispersed material comprises a matrix material 31 and particles 32 embedded therein. The embedded particles are reflective particles, for example, that scatter the radiation emitted by the active layer.

The matrix material is silicone, for example, and the particles are $TiO_2$ particles, for example.

A separating edge between the dispersed material 3 and the matrix material 31 is formed at a chip edge 22 of the semiconductor chip 2. In particular, the chip edge 22 separates the matrix material 31 and the particles 32. In this case, only the matrix material 31 is arranged on the chip surface 21, while the dispersed material 3 comprising the matrix material 31 and the particles 32 is arranged alongside the chip 2 on a carrier surface 11. The dispersed material 3 thus has two regions 3a, 3b, wherein the first region 3a is arranged above the semiconductor chip 2 and the second region 3b is arranged alongside the semiconductor chip 2. The first region 3a comprises only matrix material without embedded particles. The second region 3b comprises a dispersion of embedded particles in the matrix material. In this case, the matrix material 31 above the semiconductor chip 2 and the matrix material 31 alongside the semiconductor chip 2 are integral.

The chip edge 22 forms a filter function for the particles 32. In this case, a multiplicity of particles 32 deposit directly at the chip edge 22, wherein particles are likewise embedded in the rest of the matrix material of the dispersed material alongside the semiconductor chip 2.

The separation of the dispersed material 3 into matrix material 31 and particles 32 takes place on account of a modification of the chip edge and the chip surface of the semiconductor chip. What can be achieved as a result of a targeted alteration of the chip surface and the chip edge is that the dispersed material separates at the chip edge and thus forms a filter function for the solid constituent of the dispersion, that is to say the particles. In this case, the particles are held back behind the chip edge and thus accumulated at the chip edge.

An advantage is keeping the chip surface free of particles, while the carrier surface is simultaneously covered with the complete dispersion. Moreover, there is the possibility of adding the particles of the dispersion at the chip edge in a higher concentration. What can be achieved thereby is that the particles are added only at those locations of the component at which such addition is desired. As a result, it is possible to prevent, for example, a reflection of the radiation emitted by the active layer at the particles above the chip surface, as a result of which the coupling-out efficiency is advantageously increased. At the same time, the particles in the dispersed material alongside the semiconductor chip serve as a reflector, as a result of which the radiation emitted by the active layer can be reflected at the particles in the direction of the radiation coupling-out side. Moreover, the lateral emission of radiation from the component is advantageously suppressed by such an arrangement of the particles. This suppression is further improved by the higher concentration of the particles at the chip edge.

FIG. 2A illustrates an excerpt from a recording of a component in accordance with the example in FIG. 1. In this case, an increased concentration of the $TiO_2$ particles 32 forms at the chip edge 22. In this case, no $TiO_2$ particles are arranged on the chip surface in the region 3a. The chip edge 22 accordingly serves as a filter function for the particles 32. Alongside the semiconductor chip, a second region 3b forms in which the dispersed material comprising the matrix material and the particles are arranged. In this case, the matrix material above the semiconductor chip and the matrix material alongside the semiconductor chip are integral such that total reflections can be avoided.

In the example in FIG. 2A, the semiconductor chip has a roughening which further increases the coupling-out efficiency by the reduction of total reflections at the interface between the semiconductor chip and the matrix material.

For the rest, the example in FIG. 2A corresponds to the example in FIG. 1.

Figure 2B:
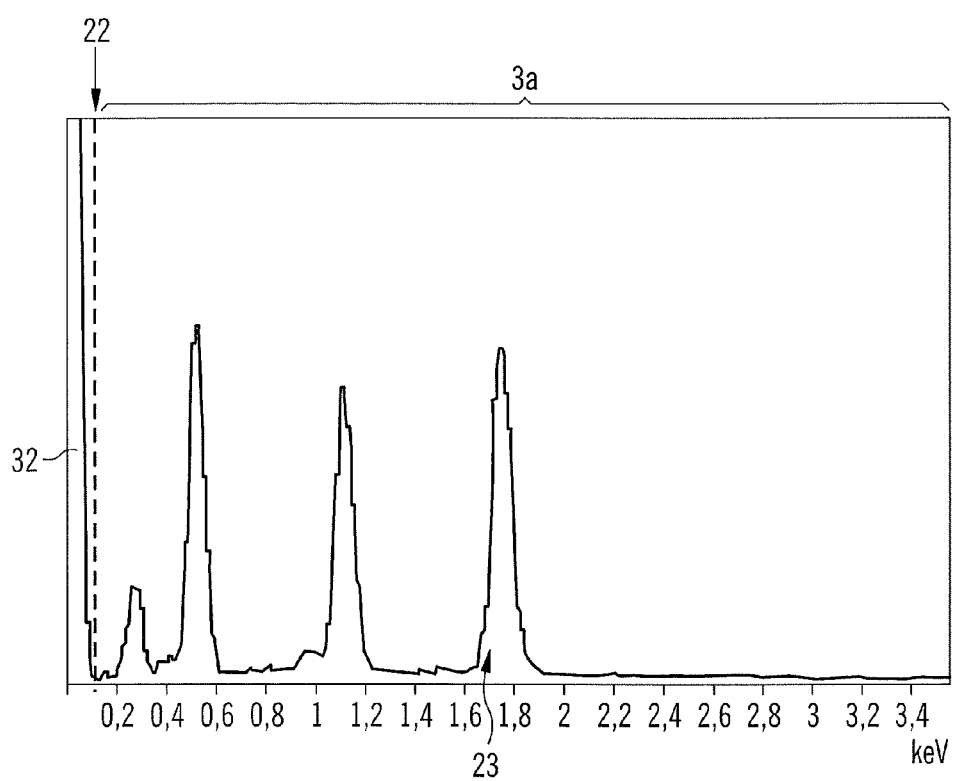
FIG. 2B shows a diagram encompassing the surface modification of the component in accordance with the example in FIG. 2A.

FIG. 2B shows a diagram illustrating the surface structuring. The chip edge that separates the dispersed material into the first region 3a and the second region is shown by the dashed line 22. The dispersed material comprising the matrix material and the particles 32 is arranged to the left of the chip edge. The matrix material without particles is shown to the right of the chip edge. As can be gathered from the diagram, the particles 32 are added on the left alongside the chip edge, which is shown with the aid of the high excursion of the value of the surface. To the right of the chip edge, in contrast, no $TiO_2$ particles are added. The excursions on this side are based on the surface roughness 23 of the chip surface. However, these roughening structures 23 have a much smaller height than the $TiO_2$ particles. This diagram accordingly shows that the matrix material can be formed by modification of the chip edge and/or of the chip surface such that no particles adhere at the modified surface or edge, with the result that, in these regions, the component is free of reflective particles. The remaining regions, by contrast, have the reflective particles embedded in the matrix material.

The diagram in FIG. 2B is, in particular, a surface measurement of the component from FIG. 2A along the lateral extent.

The example in FIG. 3 shows a cross section of a component 10. The cross section illustrated in FIG. 3 is, for example, a cross section through the component in accordance with the example in FIG. 1.

A semiconductor chip 2 is arranged in a housing, in particular in a cavity of the housing, the semiconductor chip having a chip surface 21 arranged in a manner facing away from the housing. The cavity is filled with a dispersed material 3, wherein the dispersed material has three regions on account of the chip surface modification and the chip edge modification. The first region 3a extends over the chip surface. In this region, the dispersed material only comprises the matrix material 31. Particles are not embedded in the matrix material in this region. Laterally alongside the semiconductor chip 2, the further regions 3b comprise the dispersed material comprising the matrix material and the reflective particles embedded therein, for example, $TiO_2$ particles. A filter function for the particles 32 of the dispersed material 3 is formed at the chip edge 22 or at the chip edges 22 such that the particles 32 are deposited proportionally at the chip edge 22. On account of the modification of the chip surface and the chip edge, in the production process it is possible to prevent the particles from becoming situated and adhering on the chip surface. The chip surface can thus be produced in a manner free of particles.

The component 10 emits radiation preferably in a forward direction, as illustrated by an arrow in FIG. 3. The forward direction arises in particular as a result of targeted reflection of the laterally emitted radiation at the particles 32.

For the rest, the example in FIG. 3 substantially corresponds to the example in FIG. 1.

As an alternative to the examples in FIGS. 1 to 3, the semiconductor chip can be arranged on a planar carrier rather than in a housing. Moreover, it is possible for a plurality of semiconductor chips to be arranged onto the planar carrier. By way of example, the carrier and the semiconductor chips form a wafer. Accordingly, the semiconductor chips may have been produced, in particular deposited, jointly on the carrier. To modify the surfaces of the semiconductor chips in the case of such a wafer, for example, a protective layer can be applied to the semiconductor chips. In this case, the protective layer changes the surface energy of the semiconductor chips such that the dispersed material to be applied later does not adhere on the surface of the semiconductor chips such that no reflective particles are arranged in these regions. The protective layer contains Teflon, for example.

FIG. 4 illustrates a flow chart that produces a component shown, for example, as in FIGS. 1 to 3. In method step $V_1$, a semiconductor chip is provided, which has an active layer that generates radiation and is arranged on a carrier. Alternatively, a plurality of semiconductor chips in the wafer assemblage can be provided.

In method step $V_2$, subsequently, at least the chip edge or additionally also the chip surface of the semiconductor chip or of the semiconductor chips is modified such that a dispersed material to be applied subsequently separates into its constituents at this modified edge or surface. In this case, the separation takes place such that only matrix material is applied on the modified surface and no particles find adhesion, while the dispersed material with particles is provided on the non-modified surface.

Subsequently, in method step $V_3$, the dispersed material is applied on the semiconductor chip and/or the carrier. In this case, the particles of the dispersed material are held back behind the modified chip edge or chip surface, whereby the particles do not deposit at these locations. In front of the modified edge or chip surface, in contrast, the particles deposit in an accumulated fashion. By way of example, the dispersion comprising $TiO_2$ particles and silicone separates into its constituents upon contact with the modified chip edge or chip surface. In this case, the clear silicone can propagate on the chip surface, while the $TiO_2$ particles deposit at the chip edge.

Our methods and components are not restricted to the examples by the description, but rather encompasses any novel feature and also any combination of features, which in particular includes any combination of features in the appended claims, even if the features or combinations themselves are not explicitly specified in the claims or examples.

The invention claimed is:

1. An optoelectronic component comprising:
a carrier;
a semiconductor chip having an active layer that generates radiation and is arranged on a carrier;

a dispersed material comprising a matrix material and particles embedded therein arranged on the semiconductor chip and/or the carrier at least in regions, and is integral therewith; and a separating edge between the dispersed material and matrix material formed at a chip edge of the semiconductor chip.

2. The component according to claim 1, wherein the matrix material is integral across the separating edge.

3. The component according to claim 1, wherein matrix material is arranged on a chip surface facing away from the carrier and dispersed material is arranged on a carrier surface.

4. The component according to claim 1, wherein the particles of the dispersed material are deposited at the chip edge.

5. The component according to claim 1, wherein the separating edge is formed by a protective layer made of polytetrafluoroethylene which is applied on a surface of the semiconductor chip facing away from the carrier.

6. The component according to claim 2, wherein matrix material is arranged on a chip surface facing away from the carrier and dispersed material is arranged on a carrier surface.

7. The component according to claim 2, wherein the particles of the dispersed material are deposited at the chip edge.

8. The component according to claim 3, wherein the particles of the dispersed material are deposited at the chip edge.

* * * * *